United States Patent
Biswas et al.

(10) Patent No.: US 8,443,316 B1
(45) Date of Patent: May 14, 2013

(54) ACCELERATING COVERAGE CONVERGENCE AND DEBUG USING SYMBOLIC PROPERTIES AND LOCAL MULTI-PATH ANALYSIS

(75) Inventors: Parijat Biswas, Bangalore (IN); Raghurama Krishna Srigiriraju, Bangalore (IN); Alexandru Seibulescu, San Mateo, CA (US); Gagan Vishal Jain, Bangalore (IN)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 13/293,032

(22) Filed: Nov. 9, 2011

(51) Int. Cl.
G06F 17/50 (2006.01)

(52) U.S. Cl.
USPC .......................................... 716/106; 716/136

(58) Field of Classification Search ........................ None
See application file for complete search history.

(56) References Cited

U.S. PATENT DOCUMENTS

| | | | |
|---|---|---|---|
| 6,182,258 B1 | 1/2001 | Hollander | |
| 6,513,144 B1 | 1/2003 | Kim et al. | |
| 6,609,230 B1 | 8/2003 | Li | |
| 6,859,770 B2 | 2/2005 | Ramsey | |
| 6,918,099 B2 | 7/2005 | Subbarayan | |
| 7,055,118 B1 | 5/2006 | Kamepalli et al. | |
| 7,222,315 B2 | 5/2007 | Schubert et al. | |
| 7,278,056 B2 * | 10/2007 | Hekmatpour | 714/37 |
| 7,296,249 B2 * | 11/2007 | Rinderknecht et al. | 716/106 |
| 7,315,996 B2 | 1/2008 | Baumgartner et al. | |
| 7,617,468 B2 | 11/2009 | Thakur et al. | |
| 7,818,158 B2 | 10/2010 | McDonald et al. | |
| 8,099,690 B2 | 1/2012 | Goswami et al. | |
| 2005/0278576 A1 | 12/2005 | Hekmatpour | |
| 2009/0037858 A1 | 2/2009 | Thakur et al. | |
| 2009/0249267 A1 | 10/2009 | Cerny et al. | |
| 2012/0266118 A1 | 10/2012 | Biswas et al. | |

FOREIGN PATENT DOCUMENTS

| | | |
|---|---|---|
| WO | 2005109257 A2 | 11/2005 |
| WO | 2008134215 A1 | 11/2008 |

OTHER PUBLICATIONS

Godefroid et al. "DART: Directed Automated Random Testing", ACM PLDI '05, Chicago, IL, Jun. 12-15, 2005, 11 pages.
Raman, Vishwanath et al., PowerPoint presentation entitled: "ASSERT—A Symbolic Simulation Enhanced Runtime Tester", NASA Ames, Aug. 27, 2009, 37 pages.

* cited by examiner

*Primary Examiner* — Leigh Garbowski
(74) *Attorney, Agent, or Firm* — Bever, Hoffman & Harms, LLP; Jeanette S. Harms

(57) ABSTRACT

In a method for increasing coverage convergence during verification of a design for an IC, symbolic elements can be generated for the variables and the variable expressions in the hardware code of the design and a test bench. Simulation semantics can be modified and local multi-path analysis can be provided to expand symbolic property collection and symbolic element propagation. Modifying simulation semantics can include transformation of conditional statements, flattening of conditions, avoidance of short circuiting logic, and/or symbolic triggering of events. Symbolic elements are propagated through the design and the test bench during multiple simulation runs to collect symbolic properties. Coverage information from the multiple simulation runs is analyzed to identify coverage points to be targeted. For each identified coverage point, the constraints resulting from the collected symbolic properties are solved to generate directed stimuli for the design. These directed stimuli increase the coverage convergence.

18 Claims, 6 Drawing Sheets

ACCELERATING COVERAGE CONVERGENCE AND DEBUG USING SYMBOLIC PROPERTIES AND LOCAL MULTI-PATH ANALYSIS

RELATED APPLICATION

The present application is related to U.S. patent application Ser. No. 13/087,304, filed on Apr. 14, 2011, and entitled "ACCELERATING COVERAGE CONVERGENCE USING SYMBOLIC PROPERTIES", which is incorporated by reference herein.

BACKGROUND OF THE INVENTION

1. Field of the Invention

The present invention relates to techniques for verifying the correctness of an integrated circuit design, and in particular to accelerating coverage convergence and debug using symbolic properties, modified simulation semantics, and local multi-path analysis.

2. Related Art

Integrated circuit designs have increasingly higher complexity. This complexity makes determining the correctness of the design both difficult and resource intensive. To verify the correctness of a design, a verification tool typically applies stimuli to the design under verification (DUV). In general, many stimuli and simulation runs are needed to achieve a reasonable coverage of the behavior of the DUV. The simulation outputs of the DUV can be compared to expected outputs to determine if the design is providing the desired functionality.

Coverage is a key metric that measures the quality and project completeness in the functional verification of the design. Types of coverage targets can be characterized as either functional coverage targets or code coverage targets. For functional coverage targets, a user wants to track whether some functional scenario happened in the design. For example, the user wants signal A to have value X at the same time that signal B has value Y. In contrast, the code coverage target can include branch (if, case) statement, and line coverage. These types of coverage targets are well known in the simulation industry.

Note that conventional simulations cannot generate such scenario information—hence the need for the user to specify coverage targets in a test bench. For example, FIG. 1 illustrates a conventional environment for a verification tool with an open loop, coverage convergence technique. In this environment, variables 101 of the hardware description language (HDL) code (typically in a register transfer level (RTL) format) of a design 103 are identified. In one embodiment, variables 101 are the input variables of design 103. In another embodiment, variables 101 are the input variables of specific starting points in design 103. After identification, randomized values 102 (i.e. stimuli) for variables 101 can be generated.

These randomized values 102 as well as user-provided coverage targets 104 can be provided to design 103 for simulation. Simulations can be performed using a test bench 106 and design 103 is then typically referred to as a device-under-test (DUT). The randomized values 102 are generated by test bench 106. The simulation results can be analyzed using functional verification and then provided to the user as coverage results 105.

Conventional functional verification uses constrained random simulation, which enables users to go from 0 to 80-90% coverage by automatically creating thousands of tests (i.e. different stimuli). However, getting the remaining 10-20% coverage is a very time consuming and difficult manual process. Typically, this process requires that verification engineers work with design engineers to analyze the coverage obtained so far, identify coverage holes, determine the reasons for not reaching the missing coverage targets, and write new tests to hit the missing targets and achieve coverage convergence. Unfortunately, this coverage convergence phase of verification can take up to 30% of the overall chip development cycle.

Previous techniques for automatically reaching the missing coverage targets have encountered severe scalability problems and require extensive modifications to existing verification flows and tools. One such technique relies on randomly changing paths based on symbolic properties with the goal of executing new, previously un-explored branches in the code. Notably, it has not been proven that these types of techniques lead to higher coverage.

Therefore, a need arises for a coverage convergence technique that can automatically increase the number of reached coverage targets. This technique should scale to any size design and require minimal modifications to existing verification tools.

SUMMARY OF THE INVENTION

A method for increasing coverage convergence during verification of a design for an integrated circuit is provided. In this method, multiple simulation runs are performed. Symbolic variables and symbolic expressions (called symbolic elements herein) can be generated for the variables and the variable expressions in the hardware code of the design and a test bench. Exemplary hardware code includes the hardware description language (HDL) code and/or the hardware verification language (HVL) code. Simulation semantics can be modified and local multi-path analysis can be provided to expand symbolic property collection and symbolic element propagation. Modifying simulation semantics can include transformation of conditional statements, flattening of conditions, avoidance of short circuiting logic, and/or symbolic triggering of events.

Symbolic properties, which are derived from propagating the symbolic variables and symbolic expressions through the design and the test bench during the multiple simulation runs, can be collected. Coverage information from the multiple simulation runs can be analyzed to identify coverage points to be targeted. At this point, for each identified coverage point, the constraints resulting from the collected symbolic properties can be solved to generate directed stimuli for the design. These directed stimuli can increase the coverage convergence.

The directed stimuli, instead of the symbolic variables and the symbolic expressions, can be used in a subsequent simulation to verify the expected coverage convergence. In one embodiment, debugging information can be provided to a user when a coverage target is not hit. In another embodiment, when a coverage target cannot be hit, one or more new paths through the design can be suggested.

A non-transitory, computer-readable medium storing computer-executable instructions for increasing coverage convergence during verification of a design for an integrated circuit is also provided. These computer-executable instructions, when executed by a computer, can perform the above-described steps. A system for increasing coverage convergence during verification of a design for an integrated circuit is also provided. This system can include a processor configured to perform the above-described steps.

This coverage convergence technique can advantageously solve the problem of the slow, manual coverage convergence phase of verification. Notably, this technique is applicable to designs at the block level up to full chip designs of any size.

DETAILED DESCRIPTION OF THE DRAWINGS

Figure 1:
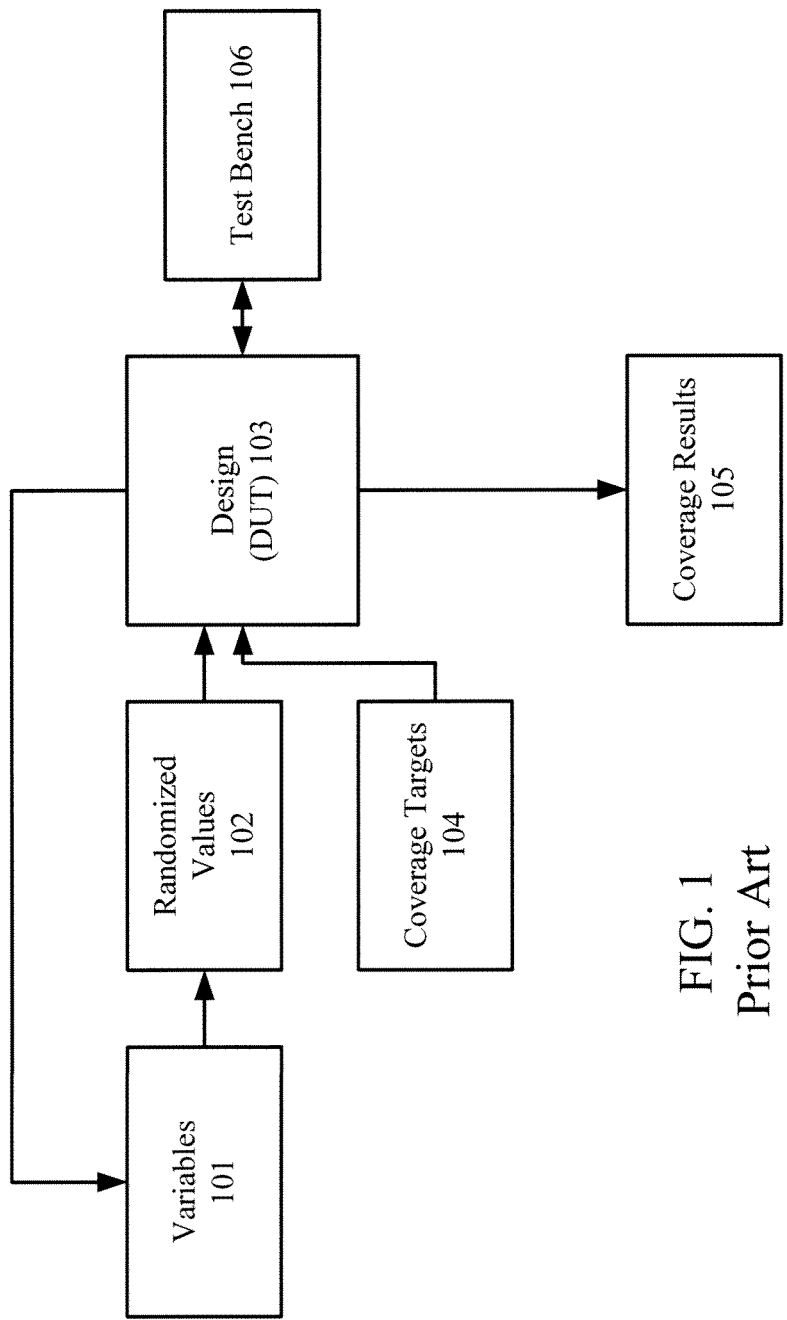
FIG. 1 illustrates a conventional environment for a verification tool with an open loop, coverage convergence technique.
Figure 2:
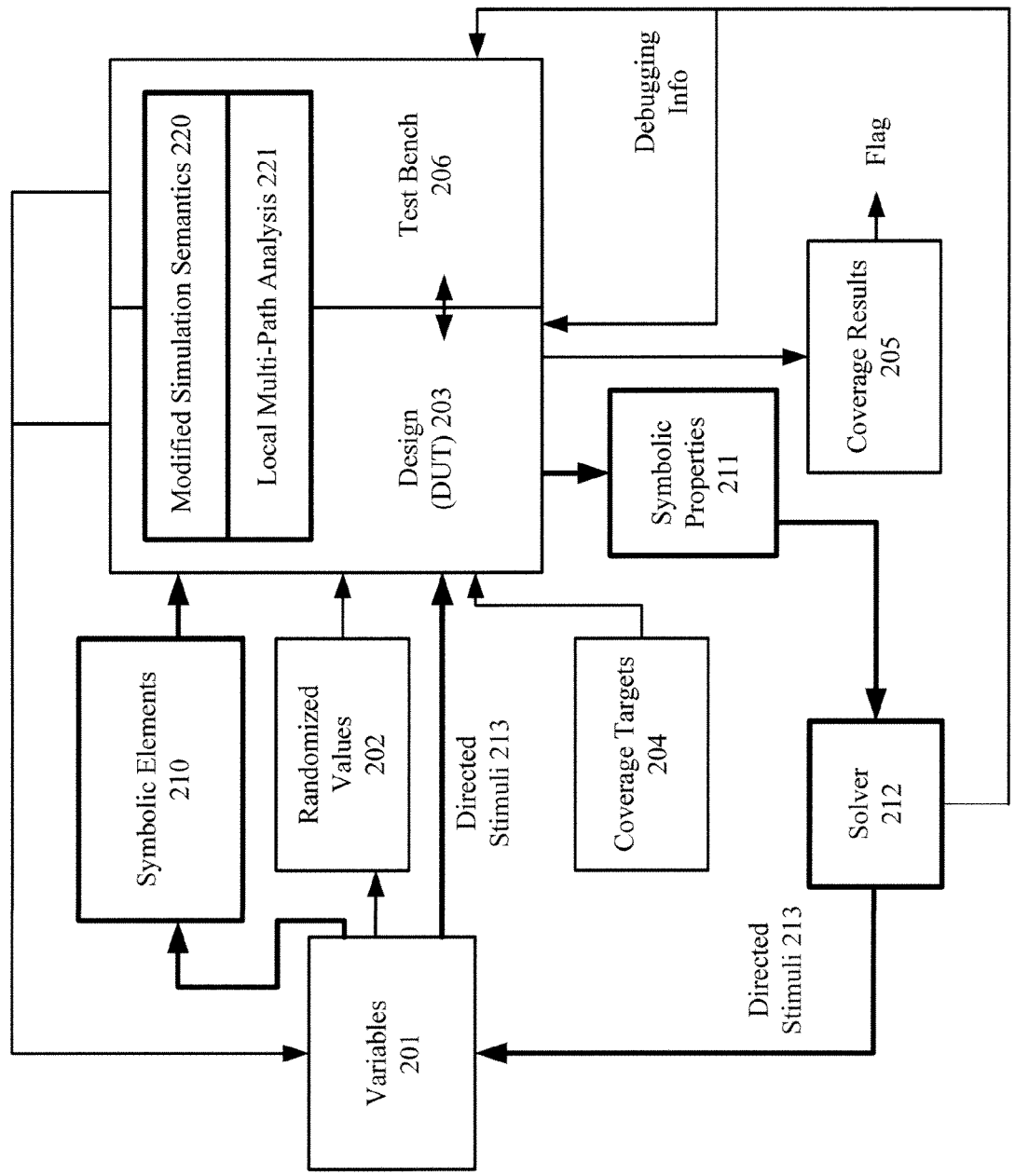
FIG. 2 illustrates an exemplary environment for a verification tool with a closed loop, coverage convergence technique.

FIG. 2 illustrates an improved environment for a verification tool, which can leverage symbolic properties to achieve higher and faster coverage convergence than conventional tools. In this environment, variables 201 of the hardware code of a design 203 and a test bench 206 can be identified. Exemplary hardware code can include hardware description language (HDL) code and/or hardware verification language (HVL) code. In one embodiment, variables 201 can include the input variables of design 203. In another embodiment, variables 201 can include the input variables of specific starting points in design 203. After identification, randomized values 202 (i.e. stimuli) can be generated for variables 201 (called constrained random verification).

These randomized values 202 as well as user-provided coverage targets 204 can be provided to design 203 for simulation. In one embodiment, these simulations can be performed using test bench 206, in which case design 203 is then typically referred to as a device-under-test (DUT) and the randomized values 202 are generated by test bench 206. In yet another embodiment, coverage targets 204 can be entered via test bench 206. The simulation results can be analyzed using functional verification and then provided to the user as coverage results 205.

Note that the verification tool performs many simulation runs, each run with new values for variables 201 (also called legal inputs for the test). As simulations are performed during those multiple runs, the verification tool accumulates information to evaluate the feasibility of reaching coverage targets. Coverage targets can be reached by executing the simulation code using the generated values of the variables to create a certain condition or certain combinations of conditions in the design, as specified by coverage targets 204. Thus, coverage results 205 effectively determine whether the desired conditions were created.

When the desired conditions are not created by constrained random verification, it is extremely difficult for the user to manually generate directed tests (i.e. assign specific values to the variables) and/or manipulate constraints to achieve those desired conditions. Therefore, in one embodiment, after constrained random verification is run for a predetermined period and coverage results 205 still indicate less than full coverage convergence (which typically occurs for any large, complex design), a flag can be generated. This flag can trigger the generation of symbolic variables and expressions.

In accordance with one aspect of an improved coverage convergence technique, the accumulated intelligence from propagated symbolic variables and expressions through design 203 and test bench 206 can advantageously provide a suggested mapping of actual values to the random variables in the stimulus in order to achieve target coverage. This accumulated intelligence can be characterized as symbolic properties 211, wherein a symbolic property is a factual statement about the expected or assumed behavior of a symbolic variable or expression. In one embodiment, when such mapping is not possible, then the verification tool can indicate why and provide enough information to generate some actionable feedback, i.e. a modification of one or more randomization constraints and/or design elements, to minimize coverage non-convergence. In one embodiment, a solver 212 analyzes symbolic properties 211 to suggest possible, directed stimuli 213 to replace randomized values 202. Directed stimuli 213 have a high probability in resulting in the desired conditions in the design.

Note that one reason that target coverage cannot be achieved is because of a bug. Therefore, in one embodiment, actionable feedback generated by solver 212 may include debugging information, which can be provided to design (DUT) 203 and test bench 206. Debugging information may include constraint modifications. For example, a constraint may be loosened when too tight (e.g. a variable value set to 5-10 should instead be set to 0-10) or tightened when too loose. Debugging information may also include modified sequential code. For example, the sequential code in test bench 206 or in design 203 may have some statements that change the stimulus to an extent that the target coverage is not achieved.

After flag generation, variables in the hardware code, the test bench code, or the constraints can be analyzed to generate symbolic variables and symbolic expressions, i.e. symbolic elements 210. In accordance with one aspect of the present invention, simulation semantics associated with symbolic elements 210 can be modified to generate modified simulation semantics 220. Modified simulation semantics 220 can be used during simulation to provide local multi-path analysis 221 in both design 203 and test bench 206. Local multi-path analysis 221 can result in increased symbolic property collection during simulation.

Exemplary types of semantic modifications can include if/else/case transformations, flattening of conditions, avoidance of short circuiting logic, and symbolic triggering of events. These types of semantic modifications are now explained in detail.

For example, consider the following simplified if/else pseudo code.

if (expr)
  c=expr1
else
  c=expr2

Previously, based on the above code, the following semantic expression is generated when expr evaluates to TRUE during simulation:

$$C_s = (\text{expr}_s == \text{TRUE}) \text{ AND } \text{expr1}_s$$

Thus, when the "if" portion is determined to be TRUE (based on the expression expr), the simulation would preclude the analysis of c=expr2, which may provide valuable symbolic properties during simulation. In accordance with one aspect of the present invention, if/else semantic expressions can be transformed. For example, the if/else semantic expression above can be modified to:

$$C_s=(expr_s==TRUE)?expr1_s:expr2_s$$

In this case, symbolic information for both paths, i.e. a first path for c=expr1 and a second path for c=expr2, can be propagated in design 203 and test bench 206 during simulation. These associated paths are defined herein as "local" paths because of their common origin in code expressions.

Consider another exemplary if/else pseudo code:
if (c1) begin
   a=rhs1;
   b=rhs2;
end
else if (c2)
   a=rhs3;
else
   a=rhs4;
In this case, previously, the simulation would take one of the three branches. However, the semantic expression can be modified to:

$$a=(c1)?rhs1:((c2)?rhs3:rhs4);$$

$$b=(c2)?rhs2:b;$$

Notably, using the modified if/else statement, the simulator can collect symbolic information on all local paths of the "if statement" block.

Consider another type of simulation semantic modification involving the flattening of conditions. For example, consider the following pseudo code:
if (c1) begin
   if (d1) begin . . .
   end
end
This nested branch would previously result in executing the child branch only when the parent is executed. However, in accordance with the present invention, the nested branch can be modified to the following simulation semantics:
if (c1 && d1) begin . . .
Notably, this modified simulation semantics allows the simulator to propagate symbolic information for the child branch even when the parent is not executed.

Consider yet another type of simulation semantic modification to avoid short circuiting logic. For example, consider the following pseudo code:
if ((a==1) && (b==2))
Using this code, the simulator will not execute the (b==2) branch if the value of "a" was not equal to 1. In accordance with the present invention, the simulation semantics will be modified so that the symbolic information from both conditions can be propagated by the simulator.

Similar modifications of simulation semantics to avoid short circuiting logic can be provided for ORs and ternary expressions.

Consider yet another type of simulation semantic modification to provide symbolic triggering of events. For example, consider the following pseudo code:
assign a=b; initial
begin
   b=expr1; // evaluates to 1'b0
   #1;
   b=expr2; // evaluates to 1'b0;
end
Using this code without modifying simulation semantics, event driven simulation would not trigger the continuous assign evaluation at time 1. However, modifying the simulation semantics would trigger the cont assign if there is a change in symbolic property of 'a' at time 1 even if the concrete value (1'b0) is the same.

Notably, using modified simulation semantics 220 during simulation can capture information in multiple paths in the vicinity of the simulation path indicated by symbolic elements 210. In one preferred embodiment, the locality of local multi-path analysis 221 is determined based only on the explicit possible paths present in the code. Note that following all paths during simulation is commercially unrealistic because of semantic/capacity issues. Therefore, a limited set of paths, as described for local multi-path analysis 221, can advantageously provide for increased symbolic property collection with minimal capacity increases.

Solving these expanded symbolic expressions in solver 212, after propagation through design 203 and test bench 206, can increase and accelerate coverage convergence and aid in coverage debug. Specifically, by combining hardware code simulation, coverage analysis, symbolic simulation, and constraint solving, a coverage convergence technique can be developed that can achieve higher and faster coverage convergence and at the same time provide relevant information to aid coverage debugging.

Figure 3:
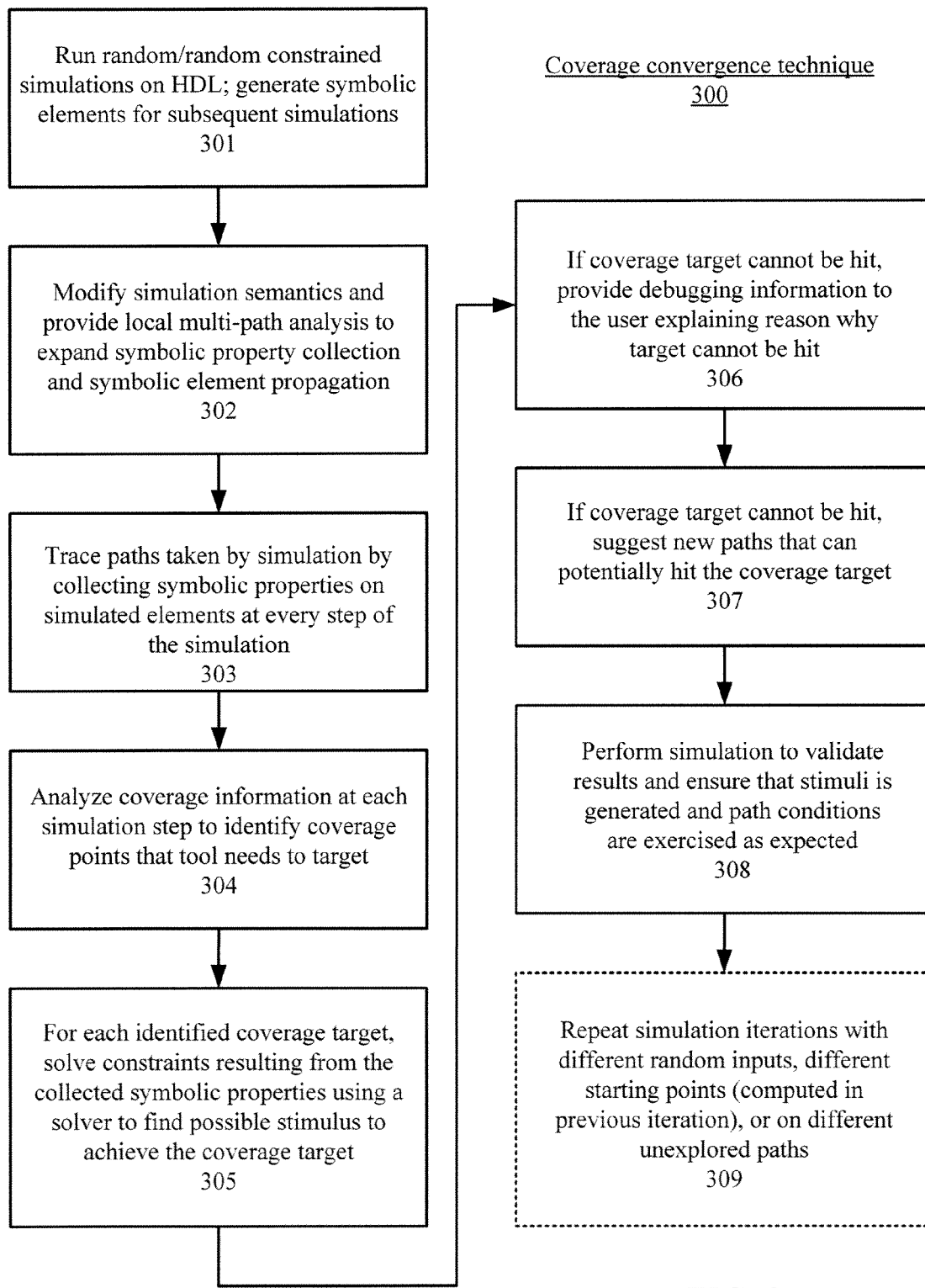
FIG. 3 illustrates a flowchart of an exemplary coverage convergence technique that uses symbolic properties to generate stimulus vectors that can achieve high coverage targets.

FIG. 3 illustrates an exemplary coverage convergence technique 300 that uses symbolic properties. Step 301 of technique 300 can run a conventional random simulation or random constrained simulation on the hardware description language (HDL) code of the design. Notably, if coverage targets cannot be hit, variables in the hardware code and the constraints can be analyzed to generate symbolic variables and symbolic expressions. In general, the symbolic variables have a functional relationship to a generated random input (e.g. added to or subtracted from the random input), and the symbolic expressions are built from symbolic variables. These symbolic variables and symbolic expressions can be propagated through paths of the design and the test bench during subsequent simulations. The collected symbolic properties derived from this propagation can advantageously facilitate determining the relationship between the sampled signals (as identified from coverage analysis) and the random inputs (specifically, the variables) that control them. Collecting the symbolic properties effectively traces the paths followed by the simulation.

Figure 4:
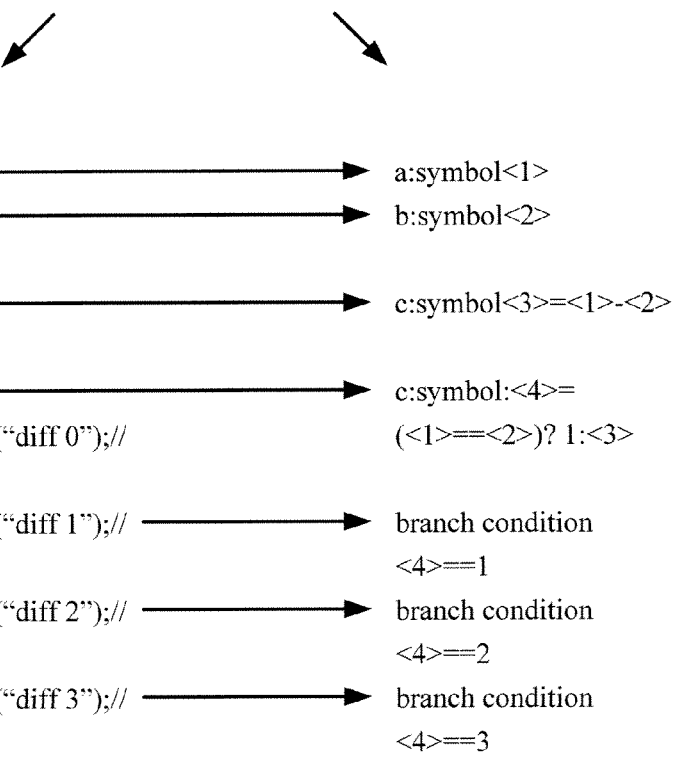
FIG. 4 illustrates an exemplary generation of symbolic variables and expressions from conventional code.

FIG. 4 illustrates the pseudo code for a simple conventional simulation 401 as well as symbolic variables and expressions 402 that correspond to the variables and the variable expressions of simulation 401. In simulation 401, "a" and "b" are random value variables, which in the design are used to construct the variable expression "c=(a−b)". In this example, symbolic variables <1> and <2> are created (to correspond to variables "a" and "b"), thereby allowing the following symbolic expressions to be generated: symbol<3>=<1>−<2>. Note that the display commands allow a user to look at the output of the simulation in order to better understand what took place. The "#" are delays in Verilog, e.g. #5 means the simulator should suspend execution of the current thread for 5 time units. The branch conditions show how the symbolic elements can be leveraged to take a particular branch, which may be the coverage target. In this case, if the symbolic expression <4> can be made equal to the value "1" then that particular branch can be entered and the coverage target associated with that branch would be reached.

The generated symbolic expressions can be sent to a solver, which can then determine a value that will likely result in a "true" condition based on symbolic properties. For example, if the user would like the value of "c" to be "1", then the solver can determine that symbol<1> must be equal to symbol<2> in order for symbol<4> (and by extension, "c") to be "1". As an add-on to a conventional verification tool including a simulator, the symbolic variables and symbolic expressions can advantageously allow tracing of design paths during simulations.

Step 302 can modify simulation semantics and provide local multi-path analysis to expand symbolic property collection and symbolic variable/expression propagation. Note that this collection and propagation is in addition to the path-specific determination performed as part of step 301. In one embodiment, the user can be notified of the additional information, with the option of decreasing local multi-path analysis during simulation to decrease run time (although possibly decreasing precision, thereby impacting system performance).

In accordance with local multi-path analysis, the symbolic properties are collected only for the local paths taken by the simulator and not all other possible branches from the path. This limited collection can advantageously minimize the required memory resources to implement the coverage convergence technique with only minimal precision loss. This path tracing can be done at every step of the simulation.

Referring back to FIG. 3, step 303 can accumulate information regarding the results of these simulations for coverage analysis. Analyzing the coverage information using the propagated symbolic elements can be performed at each simulation step in step 304 to identify intermediate coverage points that the simulator needs to target. In other words, the simulation of a design may include millions of steps with multiple symbolic elements (i.e. symbolic variables and/or symbolic expressions) being propagated to specific parts of the design and test bench during different steps. In one embodiment, the analysis can include processing of these symbolic elements as they arrive at specific parts of the design and the test bench. In another embodiment, the analysis can include accumulating these symbolic elements and then processing them at a later point in time. As described above in reference to FIG. 2, symbolic properties 211, which are derived from propagation of the symbolic elements through design 203 and test bench 206, allow solver 212 to suggest directed values (i.e. directed stimuli 213) to replace the randomized inputs for input variables 201. Such directed stimuli have a high probability in resulting in the desired conditions in the design. In one embodiment, step 304 can provide the user with a listing of the statements (i.e. lines of code) that were executed and contributed to the coverage result.

For each identified coverage target, step 305 can solve the constraints resulting from the expanded collected symbolic properties to generate directed stimuli to reach that coverage target. In step 306, if the coverage target cannot be hit, then debugging information can be provided to the user explaining why the coverage target cannot be hit. If the coverage target cannot be hit, then step 307 can suggest new paths that can potentially hit the coverage target.

Step 308 can perform standard simulation with the directed values for inputs to the design (in this loop, with no symbolic variables, symbolic expressions, random variables, modified simulation semantics, or local multi-path analysis) to validate the results. In other words, step 308 ensures that the stimuli generate the desired conditions (i.e. the user scenarios happen) in the design and the test bench. In one embodiment, an optional step 309 can repeat simulation iterations with different randomized inputs, different starting points in the design (e.g. computed in previous simulation iterations), or on different unexplored paths of the design.

Figure 5:
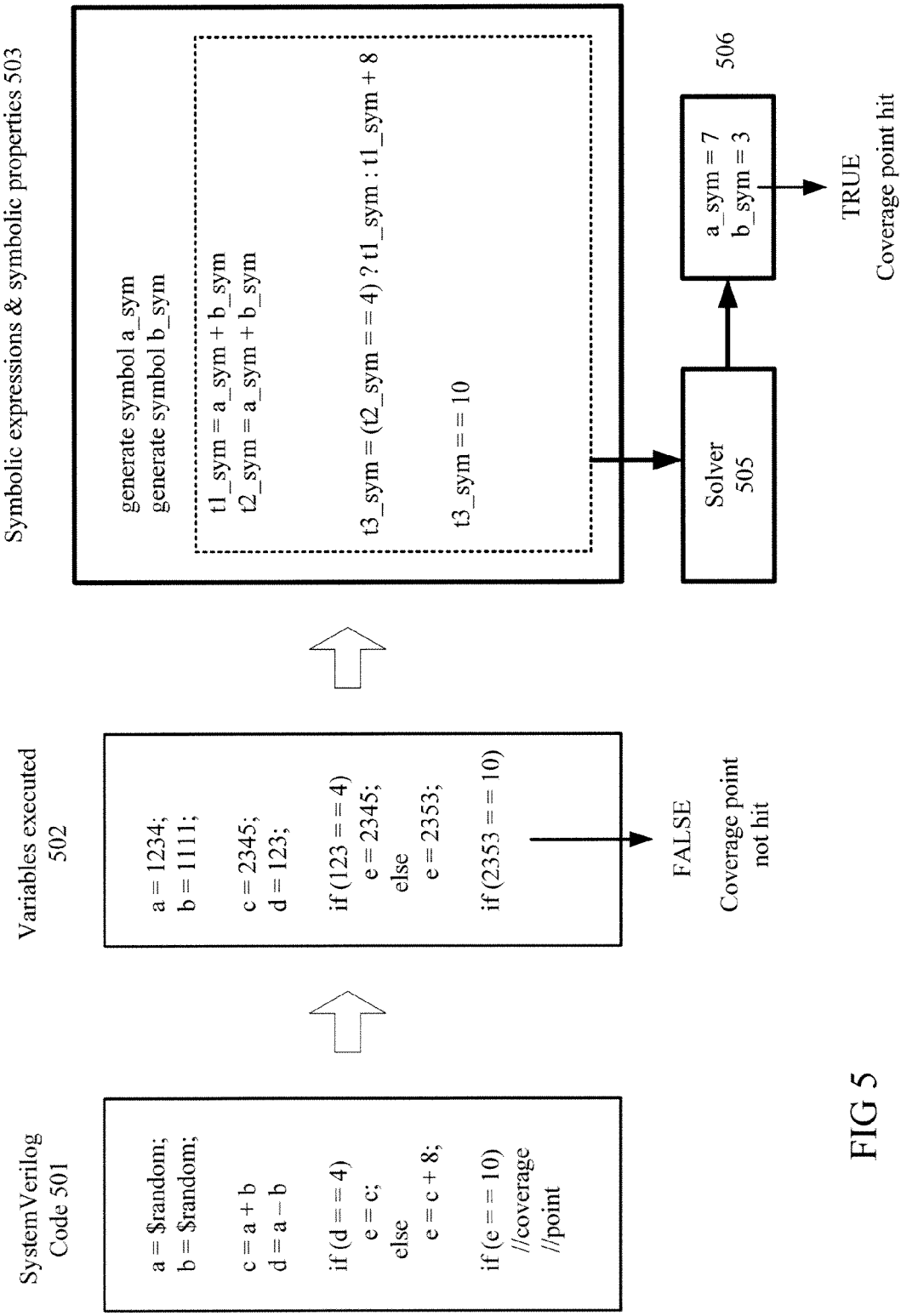
FIG. 5 illustrates an exemplary execution using standard randomized values for variables versus using symbolic properties.

FIG. 5 illustrates an exemplary execution using standard randomized values for variables versus using the symbolic properties described above. Specifically, block 501 represents some SystemVerilog code, which could describe a portion of a design. Block 502 represents one execution of that code using randomized values for variables. As noted, the result of this execution is "FALSE" and therefore the coverage point is not hit. Block 503 represents the generation of the symbolic expressions and properties. The generated symbolic properties (shown in the dotted box) can be sent to a solver 505, which generates solution 506. That is, a=7;
b=3;
c=10;
d ~4;
(4==4)? e ~10: e=18;
if (10==10)

Because solution 506 is "TRUE", the coverage point is hit. Thus, as seen from above, the use of symbolic properties can result in significantly faster coverage convergence than using conventional randomized values for variables.

The above-described transformations can be done to ensure they are "safe", i.e. they do not modify the behavior of the circuit. For example, the following code

```
if (cond) {
  if (c1)
    p=a
  else
    p-b
  ...
  if (c2)
    p=m;
  else
    p=n;
}
else {
  #1;
  p=q
}
``` can be transformed to:

```
if (cond) {
  p=c1?a:b;
  ...
  p=c2?m:n;
}
else {
  #1
  p=q
}
``` thereby ensuring that irrespective of the condition met, the behavior of the circuit does not change.

The coverage convergence technique described above can provide significant advantages over conventional techniques. For example, the coverage convergence technique using symbolic properties can provide faster, machine-assisted coverage convergence. The coverage convergence technique using symbolic properties can also provide faster, machine-assisted coverage debug. Moreover, the coverage convergence technique using symbolic properties can provide the user with hints to modify sections of code or constraints to improve coverage. The coverage convergence technique using symbolic properties can also advantageously scale with large design sizes significantly better than comparable technologies, such as formal analysis. The coverage convergence technique using symbolic properties can also advantageously leverage existing verification infrastructures and widely deployed methodologies.

Figure 6:
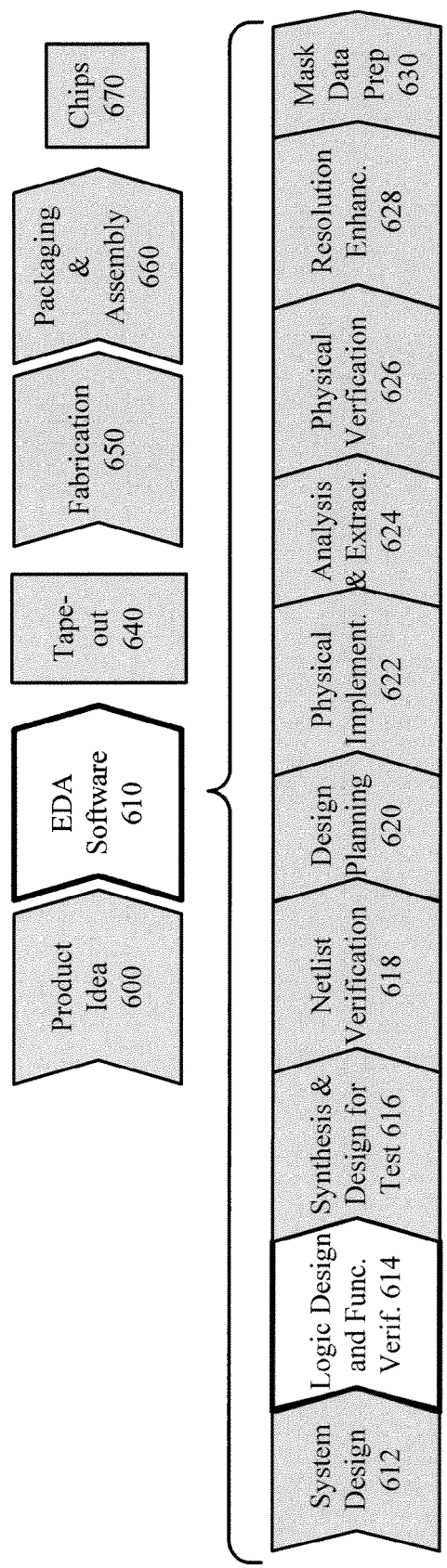
FIG. 6 illustrates a simplified representation of an exemplary digital ASIC design flow, which provides the context for the coverage convergence technique using symbolic properties.

FIG. 6 illustrates a simplified representation of an exemplary digital ASIC design flow, which provides the context for the coverage convergence technique described above. At a high level, the process starts with the product idea (step 600) and is realized in an EDA software design process (step 510). When the design is finalized, it can be taped-out (event 640). After tape out, the fabrication process (step 650) as well as packaging and assembly processes (step 660) can occur, thereby resulting in finished chips (result 670).

The EDA software design process (step 610) is actually composed of a number of steps 612-630, shown in linear fashion for simplicity. In an actual ASIC design process, the particular design might have to go back through steps until certain tests are passed. Similarly, in any actual design process, these steps may occur in different orders and combinations. This description is therefore provided by way of context and general explanation rather than as a specific, or recommended, design flow for a particular ASIC.

A brief description of the components steps of the EDA software design process (step 610) will now be provided. In system design (step 612), the designers can describe the functionality that they want to implement, perform what-if planning to refine functionality, check costs, etc. Hardware-software architecture partitioning can occur at this stage. Exemplary EDA software products from Synopsys, Inc. that can be used at this step include Model Architect, Saber, System Studio, and DesignWare® products.

In logic design and functional verification (step 614), the VHDL or Verilog code for modules in the system is written and the design is checked for functional accuracy. More specifically, the design is checked to ensure that it produces the correct outputs. Exemplary EDA software products from Synopsys, Inc. that can be used at this step include VCS, VERA, DesignWare®, Magellan, Formality, ESP and LEDA products. In one embodiment, the above-described coverage convergence technique can be implemented in the VCS tool, which is run during step 614.

In synthesis and design for test (step 616), the VHDL/Verilog code is translated to a netlist. The netlist can be optimized for the target technology. Additionally, the design and implementation of tests to permit checking of the finished chip occurs. Exemplary EDA software products from Synopsys, Inc. that can be used at this step include Design Compiler®, Power Compiler, Tetramax, and DesignWare® products.

In netlist verification (step 618), the netlist is checked for compliance with timing constraints and for correspondence with the VHDL/Verilog source code. Exemplary EDA software products from Synopsys, Inc. that can be used at this step include Formality, PrimeTime, and VCS products. In one embodiment, the samples-based, multi-corner static timing analysis can be used in step 218.

In design planning (step 620), an overall floorplan for the chip is constructed and analyzed for timing and top-level routing. Exemplary EDA software products from Synopsys, Inc. that can be used at this step include Astro and IC Compiler products.

In physical implementation (step 622), the placement (positioning of circuit elements) and routing (connection of the same) can occur. Exemplary EDA software products from Synopsys, Inc. that can be used at this step include the Astro and IC Compiler products.

In analysis and extraction (step 624), the circuit function is verified at a transistor level, which in turn permits what-if refinement. Exemplary EDA software products from Synopsys, Inc. that can be used at this step include AstroRail, PrimeRail, Primetime, and Star RC/XT products.

In physical verification (step 626), various checking functions are performed to ensure correctness for manufacturing, electrical issues, lithographic issues, and circuitry. Exemplary EDA software products from Synopsys, Inc. that can be used at this step include the Hercules product.

In resolution enhancement (step 628), geometric manipulations of the layout can be performed to improve manufacturability of the design. Exemplary EDA software products from Synopsys, Inc. that can be used at this step include Proteus, ProteusAF, and PSMGen products.

In mask data preparation (step 630), the "tape-out" data for production of masks can be lithographically used to produce the integrated circuit chips. Exemplary EDA software products from Synopsys, Inc. that can be used at this step include the CATS(R) family of products.

The coverage convergence technique described above can be implemented advantageously in one or more computer programs that execute on a programmable system including at least one programmable processor coupled to receive data and instructions from, and to transmit data and instructions to, a data storage system, at least one input device, and at least one output device. Each computer program can be implemented in a high-level procedural or object-oriented programming language, or in assembly or machine language if desired; and in any case, the language can be a compiled or interpreted language. Suitable processors include, by way of example, both general and special purpose microprocessors, as well as other types of micro-controllers. Generally, a processor will receive instructions and data from a read-only memory and/or a random access memory. Generally, a computer will include one or more mass storage devices for storing data files; such devices include magnetic disks, such as internal hard disks and removable disks, magneto-optical disks, and optical disks. Storage devices suitable for tangibly embodying computer program instructions and data include all forms of non-volatile memory, including by way of example semiconductor memory devices, such as EPROM, EEPROM, and flash memory devices, magnetic disks such as internal hard disks and removable disks, magneto-optical disks, and CDROM disks. Any of the foregoing can be supplemented by, or incorporated in, application-specific integrated circuits (ASICs).

A detailed description of one or more embodiments of the invention is provided above along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the above description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

The invention claimed is:

1. A method for increasing coverage convergence during verification of a design for an integrated circuit, the method comprising:
    generating symbolic variables and symbolic expressions for variables and variable expressions, respectively, in hardware code of the design and a test bench;

modifying simulation semantics and providing local multi-path analysis to expand symbolic collection, symbolic variable propagation, and symbolic expression propagation;

based on the modifying, collecting symbolic properties derived from the symbolic variables and symbolic expressions being propagated through the design and the test bench during multiple simulation runs;

analyzing coverage information from the multiple simulation runs to identify coverage points to be targeted; and using a computer, for each identified coverage point, solving constraints resulting from collected symbolic properties to generate directed stimuli for the design, the directed stimuli increasing the coverage convergence.

2. The method of claim 1, further including:
analyzing variables in the hardware code and the constraints to generate the symbolic variables and the symbolic expressions.

3. The method of claim 1, further including providing debugging information to a user when a coverage target is not hit.

4. The method of claim 1, further including using the directed stimuli instead of the symbolic variables and the symbolic expressions as inputs in a subsequent simulation, and then verifying expected coverage convergence of the subsequent simulation.

5. The method of claim 1, wherein modifying simulation semantics includes at least one of: transformation of conditional statements, flattening of conditions, avoidance of short circuiting logic, and symbolic triggering of events.

6. The method of claim 1, further including suggesting new paths through the design when a coverage target cannot be hit.

7. A non-transitory computer-readable medium storing computer-executable instructions for increasing coverage convergence during verification of a design for an integrated circuit, which when executed by a computer performs steps comprising:

generating symbolic variables and symbolic expressions for variables and variable expressions, respectively, in hardware code of the design and a test bench;

modifying simulation semantics and providing local multi-path analysis to expand symbolic collection, symbolic variable propagation, and symbolic expression propagation;

based on the modifying, collecting symbolic properties derived from the symbolic variables and symbolic expressions being propagated through the design and the test bench during multiple simulation runs;

analyzing coverage information from the multiple simulation runs to identify coverage points to be targeted; and for each identified coverage point, solving constraints resulting from collected symbolic properties to generate directed stimuli for the design, the directed stimuli increasing the coverage convergence.

8. The computer-readable medium of claim 7, further including:
analyzing variables in the hardware code and the constraints to generate the symbolic variables and the symbolic expressions.

9. The computer-readable medium of claim 7, further including providing debugging information to a user when a coverage target is not hit.

10. The computer-readable medium of claim 7, further including using the directed stimuli instead of the symbolic variables and the symbolic expressions as inputs in a subsequent simulation, and then verifying expected coverage convergence of the subsequent simulation.

11. The computer-readable medium of claim 7, wherein modifying simulation semantics includes at least one of: transformation of conditional statements, flattening of conditions, avoidance of short circuiting logic, and symbolic triggering of events.

12. The computer-readable medium of claim 7, further including suggesting new paths through the design when a coverage target cannot be hit.

13. A system for increasing coverage convergence during verification of a design for an integrated circuit, the system including a processor configured to perform steps comprising:

generating symbolic variables and symbolic expressions for variables and variable expressions, respectively, in hardware code of the design and a test bench;

modifying simulation semantics and providing local multi-path analysis to expand symbolic collection, symbolic variable propagation, and symbolic expression propagation;

based on the modifying, collecting symbolic properties derived from the symbolic variables and symbolic expressions being propagated through the design and the test bench during multiple simulation runs;

analyzing coverage information from the multiple simulation runs to identify coverage points to be targeted; and for each identified coverage point, solving constraints resulting from collected symbolic properties to generate directed stimuli for the design, the directed stimuli increasing the coverage convergence.

14. The system of claim 13, further including:
analyzing variables in the hardware code and the constraints to generate the symbolic variables and the symbolic expressions.

15. The system of claim 13, further including providing debugging information to a user when a coverage target is not hit.

16. The system of claim 13, further including using the directed stimuli instead of the symbolic variables and the symbolic expressions as inputs in a subsequent simulation, and then verifying expected coverage convergence of the subsequent simulation.

17. The system of claim 13, wherein modifying simulation semantics includes at least one of: transformation of conditional statements, flattening of conditions, avoidance of short circuiting logic, and symbolic triggering of events.

18. The system of claim 13, further including suggesting new paths through the design when a coverage target cannot be hit.

* * * * *